(12) United States Patent
Danner et al.

(10) Patent No.: US 8,034,209 B2
(45) Date of Patent: Oct. 11, 2011

(54) ELECTRO-OPTIC DISPLAYS, AND MATERIALS AND METHODS FOR PRODUCTION THEREOF

(75) Inventors: Guy M. Danner, Somerville, MA (US); Valerie C. Northrop, Waltham, MA (US); Jonathan D. Albert, Philadelphia, PA (US); Holly G. Gates, Somerville, MA (US); Erik van Veenendaal, Eindhoven (NL); Fredericus J. Touwslager, Veldhoven (NL)

(73) Assignee: E Ink Corporation, Cambridge, MA (US)

( * ) Notice: Subject to any disclaimer, the term of this patent is extended or adjusted under 35 U.S.C. 154(b) by 300 days.

(21) Appl. No.: 12/147,571

(22) Filed: Jun. 27, 2008

(65) Prior Publication Data
US 2009/0000729 A1  Jan. 1, 2009

Related U.S. Application Data

(60) Provisional application No. 60/947,039, filed on Jun. 29, 2007.

(51) Int. Cl.
*B29C 65/52* (2006.01)
*B32B 37/00* (2006.01)
*B32B 38/04* (2006.01)

(52) U.S. Cl. ........ 156/253; 156/256; 156/293; 156/298; 359/245; 345/105; 345/107; 445/23

(58) Field of Classification Search .......... 156/253, 156/256, 293, 298; 359/245; 345/105, 107; 445/23

See application file for complete search history.

(56) References Cited

U.S. PATENT DOCUMENTS

| 3,668,106 A | 6/1972 | Ota |
| 3,756,693 A | 9/1973 | Ota |
| 3,767,392 A | 10/1973 | Ota |
| 3,792,308 A | 2/1974 | Ota |
| 3,870,517 A | 3/1975 | Ota et al. |
| 3,892,568 A | 7/1975 | Ota |
| 4,418,346 A | 11/1983 | Batchelder |

(Continued)

FOREIGN PATENT DOCUMENTS

EP  1 099 207 B1  3/2002

(Continued)

OTHER PUBLICATIONS

Amundson, K., "Electrophoretic Imaging Films for Electronic Paper Displays" in Crawford, G. ed. Flexible Flat Panel Displays, John Wiley & Sons, Ltd., Hoboken, NJ: 2005.

(Continued)

*Primary Examiner* — Linda L Gray
(74) *Attorney, Agent, or Firm* — David J. Cole

(57) ABSTRACT

An electro-optic display is produced using a sub-assembly comprising a front sheet, an electro-optic medium; and an adhesive layer. An aperture is formed through the adhesive layer where the adhesive layer is not covered by the electro-optic medium, and the sub-assembly is adhered to a backplane having a co-operating member with the aperture engaged with a co-operating member, thus locating the sub-assembly relative to the backplane. In another form of electro-optic display, a chip extends through an aperture in the electro-optic medium and adhesive layer. In a third form, the aforementioned sub-assembly is secured to a backplane and then a cut is made through both backplane and sub-assembly to provide an aligned edge.

12 Claims, 7 Drawing Sheets

U.S. PATENT DOCUMENTS

| | | | |
|---|---|---|---|
| 5,745,094 A | 4/1998 | Gordon, II et al. | |
| 5,760,761 A | 6/1998 | Sheridon | |
| 5,777,782 A | 7/1998 | Sheridon | |
| 5,808,783 A | 9/1998 | Crowley | |
| 5,848,548 A | 12/1998 | Latour et al. | |
| 5,872,552 A | 2/1999 | Gordon, II et al. | |
| 5,930,026 A | 7/1999 | Jacobson et al. | |
| 5,961,804 A | 10/1999 | Jacobson et al. | |
| 6,017,584 A | 1/2000 | Albert et al. | |
| 6,054,071 A | 4/2000 | Mikkelsen, Jr. | |
| 6,055,091 A | 4/2000 | Sheridon et al. | |
| 6,067,185 A | 5/2000 | Albert et al. | |
| 6,097,531 A | 8/2000 | Sheridon | |
| 6,118,426 A | 9/2000 | Albert et al. | |
| 6,120,588 A | 9/2000 | Jacobson | |
| 6,120,839 A | 9/2000 | Comiskey et al. | |
| 6,124,851 A | 9/2000 | Jacobson | |
| 6,128,124 A | 10/2000 | Silverman | |
| 6,130,773 A | 10/2000 | Jacobson et al. | |
| 6,130,774 A | 10/2000 | Albert et al. | |
| 6,137,467 A | 10/2000 | Sheridon et al. | |
| 6,144,361 A | 11/2000 | Gordon, II et al. | |
| 6,147,791 A | 11/2000 | Sheridon | |
| 6,172,798 B1 | 1/2001 | Albert et al. | |
| 6,177,921 B1 | 1/2001 | Comiskey et al. | |
| 6,184,856 B1 | 2/2001 | Gordon, II et al. | |
| 6,225,971 B1 | 5/2001 | Gordon, II et al. | |
| 6,232,950 B1 | 5/2001 | Albert et al. | |
| 6,241,921 B1 | 6/2001 | Jacobson et al. | |
| 6,249,271 B1 | 6/2001 | Albert et al. | |
| 6,252,564 B1 | 6/2001 | Albert et al. | |
| 6,262,706 B1 | 7/2001 | Albert et al. | |
| 6,262,833 B1 | 7/2001 | Loxley et al. | |
| 6,271,823 B1 | 8/2001 | Gordon, II et al. | |
| 6,300,932 B1 | 10/2001 | Albert | |
| 6,301,038 B1 | 10/2001 | Fitzmaurice et al. | |
| 6,312,304 B1 | 11/2001 | Duthaler et al. | |
| 6,312,971 B1 | 11/2001 | Amundson et al. | |
| 6,323,989 B1 | 11/2001 | Jacobson et al. | |
| 6,327,072 B1 | 12/2001 | Comiskey et al. | |
| 6,376,828 B1 | 4/2002 | Comiskey | |
| 6,377,387 B1 | 4/2002 | Duthaler et al. | |
| 6,392,785 B1 | 5/2002 | Albert et al. | |
| 6,392,786 B1 | 5/2002 | Albert | |
| 6,413,790 B1 | 7/2002 | Duthaler et al. | |
| 6,422,687 B1 | 7/2002 | Jacobson | |
| 6,445,374 B2 | 9/2002 | Albert et al. | |
| 6,445,489 B1 | 9/2002 | Jacobson et al. | |
| 6,459,418 B1 | 10/2002 | Comiskey et al. | |
| 6,473,072 B1 | 10/2002 | Comiskey et al. | |
| 6,480,182 B2 | 11/2002 | Turner et al. | |
| 6,498,114 B1 | 12/2002 | Amundson et al. | |
| 6,504,524 B1 | 1/2003 | Gates et al. | |
| 6,506,438 B2 | 1/2003 | Duthaler et al. | |
| 6,512,354 B2 | 1/2003 | Jacobson et al. | |
| 6,515,649 B1 | 2/2003 | Albert et al. | |
| 6,518,949 B2 | 2/2003 | Drzaic | |
| 6,521,489 B2 | 2/2003 | Duthaler et al. | |
| 6,531,997 B1 | 3/2003 | Gates et al. | |
| 6,535,197 B1 | 3/2003 | Comiskey et al. | |
| 6,538,801 B2 | 3/2003 | Jacobson et al. | |
| 6,545,291 B1 | 4/2003 | Amundson et al. | |
| 6,580,545 B2 | 6/2003 | Morrison et al. | |
| 6,639,578 B1 | 10/2003 | Comiskey et al. | |
| 6,652,075 B2 | 11/2003 | Jacobson | |
| 6,657,772 B2 | 12/2003 | Loxley | |
| 6,664,944 B1 | 12/2003 | Albert et al. | |
| D485,294 S | 1/2004 | Albert | |
| 6,672,921 B1 | 1/2004 | Liang et al. | |
| 6,680,725 B1 | 1/2004 | Jacobson | |
| 6,683,333 B2 | 1/2004 | Kazlas et al. | |
| 6,693,620 B1 | 2/2004 | Herb et al. | |
| 6,704,133 B2 | 3/2004 | Gates et al. | |
| 6,710,540 B1 | 3/2004 | Albert et al. | |
| 6,721,083 B2 | 4/2004 | Jacobson et al. | |
| 6,724,519 B1 | 4/2004 | Comiskey et al. | |
| 6,727,881 B1 | 4/2004 | Albert et al. | |
| 6,738,050 B2 | 5/2004 | Comiskey et al. | |
| 6,750,473 B2 | 6/2004 | Amundson et al. | |
| 6,753,999 B2 | 6/2004 | Zehner et al. | |
| 6,788,449 B2 | 9/2004 | Liang et al. | |
| 6,816,147 B2 | 11/2004 | Albert | |
| 6,819,309 B1 * | 11/2004 | Kishi | 345/87 |
| 6,819,471 B2 | 11/2004 | Amundson et al. | |
| 6,822,782 B2 | 11/2004 | Honeyman et al. | |
| 6,825,068 B2 | 11/2004 | Denis et al. | |
| 6,825,829 B1 | 11/2004 | Albert et al. | |
| 6,825,970 B2 | 11/2004 | Goenaga et al. | |
| 6,831,769 B2 | 12/2004 | Holman et al. | |
| 6,839,158 B2 | 1/2005 | Albert et al. | |
| 6,842,167 B2 | 1/2005 | Albert et al. | |
| 6,842,279 B2 | 1/2005 | Amundson | |
| 6,842,657 B1 | 1/2005 | Drzaic et al. | |
| 6,864,875 B2 | 3/2005 | Drzaic et al. | |
| 6,865,010 B2 | 3/2005 | Duthaler et al. | |
| 6,866,760 B2 | 3/2005 | Paolini, Jr. et al. | |
| 6,870,657 B1 | 3/2005 | Fitzmaurice et al. | |
| 6,870,661 B2 | 3/2005 | Pullen et al. | |
| 6,900,851 B2 | 5/2005 | Morrison et al. | |
| 6,922,276 B2 | 7/2005 | Zhang et al. | |
| 6,950,220 B2 | 9/2005 | Abramson et al. | |
| 6,958,848 B2 | 10/2005 | Cao et al. | |
| 6,967,640 B2 | 11/2005 | Albert et al. | |
| 6,980,196 B1 | 12/2005 | Turner et al. | |
| 6,982,178 B2 | 1/2006 | LeCain et al. | |
| 6,987,603 B2 | 1/2006 | Paolini, Jr. et al. | |
| 6,995,550 B2 | 2/2006 | Jacobson et al. | |
| 7,002,728 B2 | 2/2006 | Pullen et al. | |
| 7,012,600 B2 | 3/2006 | Zehner et al. | |
| 7,012,735 B2 | 3/2006 | Honeyman et al. | |
| 7,023,420 B2 | 4/2006 | Comiskey et al. | |
| 7,030,412 B1 | 4/2006 | Drzaic et al. | |
| 7,030,854 B2 | 4/2006 | Baucom et al. | |
| 7,034,783 B2 | 4/2006 | Gates et al. | |
| 7,038,655 B2 | 5/2006 | Herb et al. | |
| 7,061,663 B2 | 6/2006 | Cao et al. | |
| 7,071,913 B2 | 7/2006 | Albert et al. | |
| 7,075,502 B1 | 7/2006 | Drzaic et al. | |
| 7,075,703 B2 | 7/2006 | O'Neil et al. | |
| 7,079,305 B2 | 7/2006 | Paolini, Jr. et al. | |
| 7,106,296 B1 | 9/2006 | Jacobson | |
| 7,109,968 B2 | 9/2006 | Albert et al. | |
| 7,110,163 B2 | 9/2006 | Webber et al. | |
| 7,110,164 B2 | 9/2006 | Paolini, Jr. et al. | |
| 7,116,318 B2 | 10/2006 | Amundson et al. | |
| 7,116,466 B2 | 10/2006 | Whitesides et al. | |
| 7,119,759 B2 | 10/2006 | Zehner et al. | |
| 7,119,772 B2 | 10/2006 | Amundson et al. | |
| 7,148,128 B2 | 12/2006 | Jacobson | |
| 7,167,155 B1 | 1/2007 | Albert et al. | |
| 7,170,670 B2 | 1/2007 | Webber | |
| 7,173,752 B2 | 2/2007 | Doshi et al. | |
| 7,176,880 B2 | 2/2007 | Amundson et al. | |
| 7,180,649 B2 | 2/2007 | Morrison et al. | |
| 7,190,008 B2 | 3/2007 | Amundson et al. | |
| 7,193,625 B2 | 3/2007 | Danner et al. | |
| 7,202,847 B2 | 4/2007 | Gates | |
| 7,202,991 B2 | 4/2007 | Zhang et al. | |
| 7,206,119 B2 | 4/2007 | Honeyman et al. | |
| 7,223,672 B2 | 5/2007 | Kazlas et al. | |
| 7,230,750 B2 | 6/2007 | Whitesides et al. | |
| 7,230,751 B2 | 6/2007 | Whitesides et al. | |
| 7,236,290 B1 | 6/2007 | Zhang et al. | |
| 7,236,291 B2 | 6/2007 | Kaga et al. | |
| 7,236,292 B2 | 6/2007 | LeCain et al. | |
| 7,242,513 B2 | 7/2007 | Albert et al. | |
| 7,247,379 B2 | 7/2007 | Pullen et al. | |
| 7,256,766 B2 | 8/2007 | Albert et al. | |
| 7,259,744 B2 | 8/2007 | Arango et al. | |
| 7,280,094 B2 | 10/2007 | Albert | |
| 7,304,634 B2 | 12/2007 | Albert et al. | |
| 7,304,787 B2 | 12/2007 | Whitesides et al. | |
| 7,312,784 B2 | 12/2007 | Baucom et al. | |
| 7,312,794 B2 | 12/2007 | Zehner et al. | |
| 7,312,916 B2 | 12/2007 | Pullen et al. | |
| 7,321,459 B2 | 1/2008 | Masuda et al. | |
| 7,327,511 B2 | 2/2008 | Whitesides et al. | |

| | | |
|---|---|---|
| 7,339,715 B2 | 3/2008 | Webber et al. |
| 7,349,148 B2 | 3/2008 | Doshi et al. |
| 7,352,353 B2 | 4/2008 | Albert et al. |
| 7,365,394 B2 | 4/2008 | Denis et al. |
| 7,365,733 B2 | 4/2008 | Duthaler et al. |
| 7,375,875 B2 | 5/2008 | Whitesides et al. |
| 7,382,363 B2 | 6/2008 | Albert et al. |
| 7,388,572 B2 | 6/2008 | Duthaler et al. |
| 7,391,555 B2 | 6/2008 | Albert et al. |
| 7,411,719 B2 | 8/2008 | Paolini, Jr. et al. |
| 7,411,720 B2 | 8/2008 | Honeyman et al. |
| 7,420,549 B2 | 9/2008 | Jacobson et al. |
| 7,442,587 B2 | 10/2008 | Amundson et al. |
| 7,443,571 B2 | 10/2008 | LeCain et al. |
| 7,453,445 B2 | 11/2008 | Amundson |
| 7,492,339 B2 | 2/2009 | Amundson |
| 7,492,497 B2 | 2/2009 | Paolini, Jr. et al. |
| 7,513,813 B2 | 4/2009 | Paolini, Jr. et al. |
| 7,528,822 B2 | 5/2009 | Amundson et al. |
| 7,532,388 B2 | 5/2009 | Whitesides et al. |
| 7,535,624 B2 | 5/2009 | Amundson et al. |
| 7,545,358 B2 | 6/2009 | Gates et al. |
| 7,551,346 B2 | 6/2009 | Fazel et al. |
| 7,554,712 B2 | 6/2009 | Patry et al. |
| 7,561,324 B2 | 7/2009 | Duthaler et al. |
| 7,583,251 B2 | 9/2009 | Arango et al. |
| 7,583,427 B2 | 9/2009 | Danner et al. |
| 7,598,173 B2 | 10/2009 | Ritenour et al. |
| 7,602,374 B2 | 10/2009 | Zehner et al. |
| 7,605,799 B2 | 10/2009 | Amundson et al. |
| 7,636,191 B2 | 12/2009 | Duthaler |
| 7,649,666 B2 | 1/2010 | Isobe et al. |
| 7,649,674 B2 | 1/2010 | Danner et al. |
| 7,667,684 B2 | 2/2010 | Jacobson et al. |
| 7,667,886 B2 | 2/2010 | Danner et al. |
| 7,672,040 B2 | 3/2010 | Sohn et al. |
| 7,679,599 B2 | 3/2010 | Kawai |
| 7,679,814 B2 | 3/2010 | Paolini et al. |
| 7,688,297 B2 | 3/2010 | Zehner et al. |
| 7,688,497 B2 | 3/2010 | Danner et al. |
| 7,705,824 B2 | 4/2010 | Baucom et al. |
| 7,728,811 B2 | 6/2010 | Albert et al. |
| 7,729,039 B2 | 6/2010 | LeCain et al. |
| 7,733,311 B2 | 6/2010 | Amundson et al. |
| 7,733,335 B2 | 6/2010 | Zehner et al. |
| 7,733,554 B2 | 6/2010 | Danner et al. |
| 7,746,544 B2 | 6/2010 | Comiskey et al. |
| 7,787,169 B2 | 8/2010 | Abramson et al. |
| 7,791,789 B2 | 9/2010 | Albert et al. |
| 7,826,129 B2 | 11/2010 | Wu et al. |
| 7,839,564 B2 | 11/2010 | Whitesides et al. |
| 7,843,621 B2 | 11/2010 | Danner et al. |
| 7,843,624 B2 | 11/2010 | Danner et al. |
| 7,848,006 B2 | 12/2010 | Wilcox et al. |
| 7,859,637 B2 | 12/2010 | Amundson et al. |
| 2002/0060321 A1 | 5/2002 | Kazlas et al. |
| 2002/0090980 A1 | 7/2002 | Wilcox et al. |
| 2003/0102858 A1 | 6/2003 | Jacobson et al. |
| 2004/0105036 A1 | 6/2004 | Danner et al. |
| 2004/0112750 A1 | 6/2004 | Jacobson et al. |
| 2004/0119681 A1 | 6/2004 | Albert et al. |
| 2004/0155857 A1 | 8/2004 | Duthaler et al. |
| 2004/0180476 A1 | 9/2004 | Kazlas et al. |
| 2004/0190114 A1 | 9/2004 | Jacobson et al. |
| 2004/0263947 A1 | 12/2004 | Drzaic et al. |
| 2005/0012980 A1 | 1/2005 | Wilcox et al. |
| 2005/0024353 A1 | 2/2005 | Amundson et al. |
| 2005/0062714 A1 | 3/2005 | Zehner et al. |
| 2005/0122284 A1 | 6/2005 | Gates et al. |
| 2005/0122306 A1 | 6/2005 | Wilcox et al. |
| 2005/0122563 A1 | 6/2005 | Honeyman et al. |
| 2005/0151709 A1 | 7/2005 | Jacobson et al. |
| 2005/0156340 A1 | 7/2005 | Valianatos et al. |
| 2005/0179642 A1 | 8/2005 | Wilcox et al. |
| 2005/0212747 A1 | 9/2005 | Amundson |
| 2005/0253777 A1 | 11/2005 | Zehner et al. |
| 2005/0259068 A1 | 11/2005 | Nihei et al. |
| 2005/0280626 A1 | 12/2005 | Amundson et al. |
| 2006/0038772 A1 | 2/2006 | Amundson et al. |
| 2006/0087479 A1 | 4/2006 | Sakurai et al. |
| 2006/0087489 A1 | 4/2006 | Sakurai et al. |
| 2006/0087718 A1 | 4/2006 | Takagi et al. |
| 2006/0139308 A1 | 6/2006 | Jacobson et al. |
| 2006/0139311 A1 | 6/2006 | Zehner et al. |
| 2006/0176267 A1 | 8/2006 | Honeyman et al. |
| 2006/0181492 A1 | 8/2006 | Gates et al. |
| 2006/0181504 A1 | 8/2006 | Kawai |
| 2006/0194619 A1 | 8/2006 | Wilcox et al. |
| 2006/0202949 A1 | 9/2006 | Danner et al. |
| 2006/0209008 A1 | 9/2006 | Nihei et al. |
| 2006/0214906 A1 | 9/2006 | Kobayashi et al. |
| 2006/0231401 A1 | 10/2006 | Sakurai et al. |
| 2006/0238488 A1 | 10/2006 | Nihei et al. |
| 2006/0263927 A1 | 11/2006 | Sakurai et al. |
| 2006/0279527 A1 | 12/2006 | Zehner et al. |
| 2006/0291034 A1 | 12/2006 | Patry et al. |
| 2007/0013683 A1 | 1/2007 | Zhou et al. |
| 2007/0035808 A1 | 2/2007 | Amundson et al. |
| 2007/0052757 A1 | 3/2007 | Jacobson |
| 2007/0057908 A1 | 3/2007 | Jacobson |
| 2007/0069247 A1 | 3/2007 | Amundson et al. |
| 2007/0091417 A1 | 4/2007 | Cao et al. |
| 2007/0091418 A1 | 4/2007 | Danner et al. |
| 2007/0097489 A1 | 5/2007 | Doshi et al. |
| 2007/0103427 A1 | 5/2007 | Zhou et al. |
| 2007/0146310 A1 | 6/2007 | Paolini, Jr. et al. |
| 2007/0152956 A1 | 7/2007 | Danner et al. |
| 2007/0200795 A1 | 8/2007 | Whitesides et al. |
| 2007/0200874 A1 | 8/2007 | Amundson et al. |
| 2007/0211002 A1 | 9/2007 | Zehner et al. |
| 2007/0223079 A1 | 9/2007 | Honeyman et al. |
| 2007/0247697 A1 | 10/2007 | Sohn et al. |
| 2007/0285385 A1 | 12/2007 | Albert et al. |
| 2007/0286975 A1 | 12/2007 | Fazel et al. |
| 2008/0013155 A1 | 1/2008 | Honeyman et al. |
| 2008/0013156 A1 | 1/2008 | Whitesides et al. |
| 2008/0023332 A1 | 1/2008 | Webber et al. |
| 2008/0024429 A1 | 1/2008 | Zehner |
| 2008/0024482 A1 | 1/2008 | Gates et al. |
| 2008/0030832 A1 | 2/2008 | Paolini, Jr. et al. |
| 2008/0043318 A1 | 2/2008 | Whitesides et al. |
| 2008/0048969 A1 | 2/2008 | Whitesides et al. |
| 2008/0048970 A1 | 2/2008 | Drzaic et al. |
| 2008/0054879 A1 | 3/2008 | LeCain et al. |
| 2008/0074730 A1 | 3/2008 | Cao et al. |
| 2008/0117495 A1 | 5/2008 | Arango et al. |
| 2008/0129667 A1 | 6/2008 | Zehner et al. |
| 2008/0130092 A1 | 6/2008 | Whitesides et al. |
| 2008/0136774 A1 | 6/2008 | Harris et al. |
| 2008/0137176 A1 | 6/2008 | Isobe et al. |
| 2008/0150888 A1 | 6/2008 | Albert et al. |
| 2008/0165122 A1 | 7/2008 | Duthaler et al. |
| 2008/0174853 A1 | 7/2008 | Danner et al. |
| 2008/0211764 A1 | 9/2008 | Albert et al. |
| 2008/0211765 A1 | 9/2008 | Comiskey et al. |
| 2008/0218839 A1 | 9/2008 | Paolini, Jr. et al. |
| 2008/0266245 A1 | 10/2008 | Wilcox et al. |
| 2008/0273132 A1 | 11/2008 | Hsu et al. |
| 2008/0291129 A1 | 11/2008 | Harris et al. |
| 2008/0309350 A1 | 12/2008 | Danner et al. |
| 2009/0004442 A1 | 1/2009 | Danner |

FOREIGN PATENT DOCUMENTS

| | | |
|---|---|---|
| EP | 1 145 072 B1 | 5/2003 |
| WO | WO 00/36560 | 6/2000 |
| WO | WO 00/38000 | 6/2000 |
| WO | WO 00/67110 | 11/2000 |
| WO | WO 01/07961 | 2/2001 |

OTHER PUBLICATIONS

Amundson, K., et al., "Flexible, Active-Matrix Display Constructed Using a Microencapsulated Electrophoretic Material and an Organic-Semiconductor-Based Backplane", SID 01 Digest, 160 (Jun. 2001).

Au, J. et al., "Ultra-Thin 3.1-in. Active-Matrix Electronic Ink Display for Mobile Devices", IDW'02, 223 (2002).

Bach, U., et al., "Nanomaterials-Based Electrochromics for Paper-Quality Displays", Adv. Mater, 14(11), 845 (2002).

Bouchard, A. et al., "High-Resolution Microencapsulated Electrophoretic Display on Silicon", SID 04 Digest, 651 (2004).

Caillot, E. et al. "Active Matrix Electrophoretic Information Display for High Performance Mobile Devices", IDMC Proceedings (2003).

Chen, Y., et al., "A Conformable Electronic Ink Display using a Foil-Based a-Si TFT Array", SID 01 Digest, 157 (Jun. 2001).

Comiskey, B., et al., "An electrophoretic ink for all-printed reflective electronic displays", Nature, 394, 253 (1998).

Comiskey, B., et al., "Electrophoretic Ink: A Printable Display Material", SID 97 Digest (1997), p. 75.

Danner, G.M. et al., "Reliability Performance for Microencapsulated Electrophoretic Displays with Simulated Active Matrix Drive", SID 03 Digest, 573 (2003).

Drzaic, P., et al., "A Printed and Rollable Bistable Electronic Display", SID 98 Digest (1998), p. 1131.

Duthaler, G., et al., "Active-Matrix Color Displays Using Electrophoretic Ink and Color Filters", SID 02 Digest, 1374 (2002).

Gates, H. et al., "A5 Sized Electronic Paper Display for Document Viewing", SID 05 Digest, (2005).

Hayes, R.A., et al., "Video-Speed Electronic Paper Based on Electrowetting", Nature, vol. 425, Sep. 25, pp. 383-385 (2003).

Henzen, A. et al., "An Electronic Ink Low Latency Drawing Tablet", SID 04 Digest, 1070 (2004).

Henzen, A. et al., "Development of Active Matrix Electronic Ink Displays for Handheld Devices", SID 03 Digest, 176, (2003).

Henzen, A. et al., "Development of Active Matrix Electronic Ink Displays for Smart Handheld Applications", IDW'02, 227 (2002).

Jacobson, J., et al., "The last book", IBM Systems J., 36, 457 (1997).

Jo, G-R, et al., "Toner Display Based on Particle Movements", Chem. Mater, 14, 664 (2002).

Johnson, M. et al., "High Quality Images on Electronic Paper Displays", SID 05 Digest, 1666 (2005).

Kazlas, P. et al., "Card-size Active-matrix Electronic Ink Display", Eurodisplay 2002, 259 (2002).

Kazlas, P., et al., "12.1" SVGA Microencapsulated Electrophoretic Active Matrix Display for Information Applicances, SID 01 Digest, 152 (Jun. 2001).

Kitamura, T., et al., "Electrical toner movement for electronic paper-like display", Asia Display/IDW '01, p. 1517, Paper HCS1-1 (2001).

O'Regan, B. et al., "A Low Cost, High-efficiency Solar Cell Based on Dye-sensitized colloidal TiO2 Films", Nature, vol. 353, Oct. 24, 1991, 773-740.

Pitt, M.G., et al., "Power Consumption of Microencapsulated Electrophoretic Displays for Smart Handheld Applications", SID 02 Digest, 1378 (2002).

Webber, R., "Image Stability in Active-Matrix Microencapsulated Electrophoretic Displays", SID 02 Digest, 126 (2002).

Whitesides, T. et al., "Towards Video-rate Microencapsulated Dual-Particle Electrophoretic Displays", SID 04 Digest, 133 (2004).

Wood, D., "An Electrochromic Renaissance?" Information Display, 18(3), 24 (Mar. 2002).

Yamaguchi, Y., et al., "Toner display using insulative particles charged triboelectrically", Asia Display/IDW '01, p. 1729, Paper AMD4-4 (2001).

Zehner, R. et al., "Drive Waveforms for Active Matrix Electrophoretic Displays", SID 03 Digest, 842 (2003).

* cited by examiner

ELECTRO-OPTIC DISPLAYS, AND MATERIALS AND METHODS FOR PRODUCTION THEREOF

REFERENCE TO RELATED APPLICATIONS

This application claims benefit of Application Ser. No. 60/947,039, filed Jun. 29, 2007.

This invention is also related to:
(a) U.S. Pat. No. 6,982,178;
(b) copending Application Ser. No. 10/605,024, filed Sep. 2, 2003 (Publication No. 2004/0155857, now U.S. Pat. No. 7,561,324), which claims benefit of Application Ser. No. 60/319,516, filed Sep. 3, 2002;
(c) U.S. Pat. No. 7,110,164;
(d) U.S. Pat. No. 7,075,703;
(e) U.S. Patent Publication No. 2007/0109219, now U.S. Pat. No. 7,839,564;
(f) U.S. Patent Publication No. 2007/0152956, now U.S. Pat. No. 7,649,674;
(g) U.S. Patent Publication No. 2007/0211331, now U.S. Pat. No. 7,733,554; and
(h) U.S. Patent Publication No. 2008/0057252, now U.S. Pat. No. 7,583,427.

The entire contents of these copending applications, publications and patents, and of all other U.S. patents and published and copending applications mentioned below, are herein incorporated by reference.

BACKGROUND OF INVENTION

This invention relates to electro-optic displays, and to materials and methods for the production of such displays. This invention is particularly, but not exclusively, intended for use with displays comprising encapsulated electrophoretic media. However, the invention can also make use of various other types of electro-optic media which are solid, in the sense that they have solid external surfaces, although the media may, and often do, have internal cavities which contain a fluid (either liquid or gas). Thus, the term "solid electro-optic displays" includes encapsulated electrophoretic displays, encapsulated liquid crystal displays, and other types of displays discussed below.

Electro-optic displays comprise a layer of electro-optic material, a term which is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudocolor in the sense of a change in reflectance of electromagnetic wavelengths outside the visible range.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Several types of electro-optic displays are known. One type of electro-optic display is a rotating bichromal member type as described, for example, in U.S. Pat. Nos. 5,808,783; 5,777,782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed by applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038; 6,870,657; and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, 425, 383-385 (2003). It is shown in copending application Ser. No. 10/711,802, filed Oct. 6, 2004 (Publication No. 2005/0151709), that such electro-wetting displays can be made bistable.

Another type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

As noted above, electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y., et al., "Toner display using insulative particles charged triboelectrically", IDW Japan, 2001, Paper AMD4-4). See also U.S. Patent Publication Nos. 2005/0259068, 2006/0087479, 2006/0087489, 2006/0087718, 2006/0209008, 2006/0214906, 2006/0231401, 2006/0238488, 2006/0263927 and U.S. Pat.

Nos. 7,321,459 and 7,236,291. Such gas-based electrophoretic media appear to be susceptible to the same types of problems due to particle settling as liquid-based electrophoretic media, when the media are used in an orientation which permits such settling, for example in a sign where the medium is disposed in a vertical plane. Indeed, particle settling appears to be a more serious problem in gas-based electrophoretic media than in liquid-based ones, since the lower viscosity of gaseous suspending fluids as compared with liquid ones allows more rapid settling of the electrophoretic particles.

Numerous patents and applications assigned to or in the names of the Massachusetts Institute of Technology (MIT) and E Ink Corporation have recently been published describing encapsulated electrophoretic media. Such encapsulated media comprise numerous small capsules, each of which itself comprises an internal phase containing electrophoretically-mobile particles suspended in a liquid suspending medium, and a capsule wall surrounding the internal phase. Typically, the capsules are themselves held within a polymeric binder to form a coherent layer positioned between two electrodes. Encapsulated media of this type are described, for example, in U.S. Pat. Nos. 5,930,026; 5,961,804; 6,017,584; 6,067,185; 6,118,426; 6,120,588; 6,120,839; 6,124,851; 6,130,773; 6,130,774; 6,172,798; 6,177,921; 6,232,950; 6,249,271; 6,252,564; 6,262,706; 6,262,833; 6,300,932; 6,312,304; 6,312,971; 6,323,989; 6,327,072; 6,376,828; 6,377,387; 6,392,785; 6,392,786; 6,413,790; 6,422,687; 6,445,374; 6,445,489; 6,459,418; 6,473,072; 6,480,182; 6,498,114; 6,504,524; 6,506,438; 6,512,354; 6,515,649; 6,518,949; 6,521,489; 6,531,997; 6,535,197; 6,538,801; 6,545,291; 6,580,545; 6,639,578; 6,652,075; 6,657,772; 6,664,944; 6,680,725; 6,683,333; 6,704,133; 6,710,540; 6,721,083; 6,724,519; 6,727,881; 6,738,050; 6,750,473; 6,753,999; 6,816,147; 6,819,471; 6,822,782; 6,825,068; 6,825,829; 6,825,970; 6,831,769; 6,839,158; 6,842,167; 6,842,279; 6,842,657; 6,864,875; 6,865,010; 6,866,760; 6,870,661; 6,900,851; 6,922,276; 6,950,200; 6,958,848; 6,967,640; 6,982,178; 6,987,603; 6,995,550; 7,002,728; 7,012,600; 7,012,735; 7,023,420; 7,030,412; 7,030,854; 7,034,783; 7,038,655; 7,061,663; 7,071,913; 7,075,502; 7,075,703; 7,079,305; 7,106,296; 7,109,968; 7,110,163; 7,110,164; 7,116,318; 7,116,466; 7,119,759; 7,119,772; 7,148,128; 7,167,155; 7,170,670; 7,173,752; 7,176,880; 7,180,649; 7,190,008; 7,193,625; 7,202,847; 7,202,991; 7,206,119; 7,223,672; 7,230,750; 7,230,751; 7,236,790; 7,236,792; 7,242,513; 7,247,379; 7,256,766; 7,259,744; 7,280,094; 7,304,634; 7,304,787; 7,312,784; 7,312,794; 7,312,916; 7,237,511; 7,339,715; 7,349,148; 7,352,353; 7,365,394; and 7,365,733; and U.S. Patent Applications Publication Nos. 2002/0060321; 2002/0090980; 2003/0102858; 2003/0151702; 2003/0222315; 2004/0105036; 2004/0112750; 2004/0119681; 2004/0155857; 2004/0180476; 2004/0190114; 2004/0257635; 2004/0263947; 2005/0000813; 2005/0007336; 2005/0012980; 2005/0018273; 2005/0024353; 2005/0062714; 2005/0099672; 2005/0122284; 2005/0122306; 2005/0122563; 2005/0134554; 2005/0151709; 2005/0152018; 2005/0156340; 2005/0179642; 2005/0190137; 2005/0212747; 2005/0253777; 2005/0280626; 2006/0007527; 2006/0038772; 2006/0139308; 2006/0139310; 2006/0139311; 2006/0176267; 2006/0181492; 2006/0181504; 2006/0194619; 2006/0197737; 2006/0197738; 2006/0202949; 2006/0223282; 2006/0232531; 2006/0245038; 2006/0262060; 2006/0279527; 2006/0291034; 2007/0035532; 2007/0035808; 2007/0052757; 2007/0057908; 2007/0069247; 2007/0085818; 2007/0091417; 2007/0091418; 2007/0109219; 2007/0128352; 2007/0146310; 2007/0152956; 2007/0153361; 2007/0200795; 2007/0200874; 2007/0201124; 2007/0207560; 2007/0211002; 2007/0211331; 2007/0223079; 2007/0247697; 2007/0285385; 2007/0286975; 2007/0286975; 2008/0013155; 2008/0013156; 2008/0023332; 2008/0024429; 2008/0024482; 2008/0030832; 2008/0043318; 2008/0048969; 2008/0048970; 2008/0054879; 2008/0057252; and 2008/0074730; and International Applications Publication Nos. WO 00/38000; WO 00/36560; WO 00/67110; and WO 01/07961; and European Patents Nos. 1,099,207 B1; and 1,145,072 B1.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned U.S. Pat. No. 6,866,760. Accordingly, for purposes of the present application, such polymer-dispersed electrophoretic media are regarded as sub-species of encapsulated electrophoretic media.

A related type of electrophoretic display is a so-called "microcell electrophoretic display". In a microcell electrophoretic display, the charged particles and the fluid are not encapsulated within microcapsules but instead are retained within a plurality of cavities formed within a carrier medium, typically a polymeric film. See, for example, U.S. Pat. Nos. 6,672,921 and 6,788,449, both assigned to Sipix Imaging, Inc.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, the aforementioned U.S. Pat. Nos. 6,130,774 and 6,172,798, and U.S. Pat. Nos. 5,872,552; 6,144,361; 6,271,823; 6,225,971; and 6,184,856. Dielectrophoretic displays, which are similar to electrophoretic displays but rely upon variations in electric field strength, can operate in a similar mode; see U.S. Pat. No. 4,418,346. Other types of electro-optic displays may also be capable of operating in shutter mode.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; electrophoretic deposition (See U.S. Pat. No. 7,339,715); and other similar techniques.) Thus, the resulting display can be flexible. Further, because the display medium can be printed (using a variety of methods), the display itself can be made inexpensively.

Other types of electro-optic materials may also be used in the present invention.

An electro-optic display normally comprises a layer of electro-optic material and at least two other layers disposed on opposed sides of the electro-optic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electro-optic display, which is intended for use with a stylus, print head or similar movable electrode separate from the display, only one of the layers adjacent the electro-optic layer comprises an electrode, the layer on the opposed side of the electro-optic layer typically being a protective layer intended to prevent the movable electrode damaging the electro-optic layer.

The manufacture of a three-layer electro-optic display normally involves at least one lamination operation. For example, in several of the aforementioned MIT and E Ink patents and applications, there is described a process for manufacturing an encapsulated electrophoretic display in which an encapsulated electrophoretic medium comprising capsules in a binder is coated on to a flexible substrate comprising indium tin oxide (ITO) or a similar conductive coating (which acts as an one electrode of the final display) on a plastic film, the capsules/binder coating being dried to form a coherent layer of the electrophoretic medium firmly adhered to the substrate. Separately, a backplane, containing an array of pixel electrodes and an appropriate arrangement of conductors to connect the pixel electrodes to drive circuitry, is prepared. To form the final display, the substrate having the capsule/binder layer thereon is laminated to the backplane using a lamination adhesive. (A very similar process can be used to prepare an electrophoretic display usable with a stylus or similar movable electrode by replacing the backplane with a simple protective layer, such as a plastic film, over which the stylus or other movable electrode can slide.) In one preferred form of such a process, the backplane is itself flexible and is prepared by printing the pixel electrodes and conductors on a plastic film or other flexible substrate. The obvious lamination technique for mass production of displays by this process is roll lamination using a lamination adhesive. Similar manufacturing techniques can be used with other types of electro-optic displays. For example, a microcell electrophoretic medium or a rotating bichromal member medium may be laminated to a backplane in substantially the same manner as an encapsulated electrophoretic medium.

As discussed in the aforementioned U.S. Pat. No. 6,982,178, (see column 3, lines 63 to column 5, line 46) many of the components used in solid electro-optic displays, and the methods used to manufacture such displays, are derived from technology used in liquid crystal displays (LCD's), which are of course also electro-optic displays, though using a liquid rather than a solid medium. For example, solid electro-optic displays may make use of an active matrix backplane comprising an array of transistors or diodes and a corresponding array of pixel electrodes, and a "continuous" front electrode (in the sense of an electrode which extends over multiple pixels and typically the whole display) on a transparent substrate, these components being essentially the same as in LCD's. However, the methods used for assembling LCD's cannot be used with solid electro-optic displays. LCD's are normally assembled by forming the backplane and front electrode on separate glass substrates, then adhesively securing these components together leaving a small aperture between them, placing the resultant assembly under vacuum, and immersing the assembly in a bath of the liquid crystal, so that the liquid crystal flows through the aperture between the backplane and the front electrode. Finally, with the liquid crystal in place, the aperture is sealed to provide the final display.

This LCD assembly process cannot readily be transferred to solid electro-optic displays. Because the electro-optic material is solid, it must be present between the backplane and the front electrode before these two integers are secured to each other. Furthermore, in contrast to a liquid crystal material, which is simply placed between the front electrode and the backplane without being attached to either, a solid electro-optic medium normally needs to be secured to both; in most cases the solid electro-optic medium is formed on the front electrode, since this is generally easier than forming the medium on the circuitry-containing backplane, and the front electrode/electro-optic medium combination is then laminated to the backplane, typically by covering the entire surface of the electro-optic medium with an adhesive and laminating under heat, pressure and possibly vacuum. Accordingly, most prior art methods for final lamination of solid electrophoretic displays are essentially batch methods in which (typically) the electro-optic medium, a lamination adhesive and a backplane are brought together immediately prior to final assembly, and it is desirable to provide methods better adapted for mass production.

Electro-optic displays are often costly; for example, the cost of the color LCD found in a portable computer is typically a substantial fraction of the entire cost of the computer. As the use of electro-optic displays spreads to devices, such as cellular telephones and personal digital assistants (PDA's), much less costly than portable computers, there is great pressure to reduce the costs of such displays. The ability to form layers of some solid electro-optic media by printing techniques on flexible substrates, as discussed above, opens up the possibility of reducing the cost of electro-optic components of displays by using mass production techniques such as roll-to-roll coating using commercial equipment used for the production of coated papers, polymeric films and similar media.

The aforementioned U.S. Pat. No. 6,982,178 describes a method of assembling a solid electro-optic display (including an encapsu lated electrophoretic display) which is well adapted for mass production. Essentially, this patent describes a so-called "front plane laminate" ("FPL") which comprises, in order, a light-transmissive electrically-conductive layer; a layer of a solid electro-optic medium in electrical contact with the electrically-conductive layer; an adhesive layer; and a release sheet. Typically, the light-transmissive electrically-conductive layer will be carried on a light-transmissive substrate, which is preferably flexible, in the sense that the substrate can be manually wrapped around a drum (say) 10 inches (254 mm) in diameter without permanent deformation. The term "light-transmissive" is used in this patent and herein to mean that the layer thus designated transmits sufficient light to enable an observer, looking through that layer, to observe the change in display states of the electro-optic medium, which will normally be viewed through the electrically-conductive layer and adjacent substrate (if present); in cases where the electro-optic medium displays a change in reflectivity at non-visible wavelengths, the term "light-transmissive" should of course be interpreted to refer to transmission of the relevant non-visible wavelengths. The substrate will typically be a polymeric film, and will normally have a thickness in the range of about 1 to about 25 mil (25 to 634 μm), preferably about 2 to about 10 mil (51 to 254 μm). The electrically-conductive layer is conveniently a thin metal or metal oxide layer of, for example, aluminum or ITO, or may be a conductive polymer. Poly(ethylene terephthalate) (PET) films coated with aluminum or ITO are available commercially, for example as "aluminized Mylar" ("Mylar" is a Registered Trade Mark) from E.I. du Pont de Nemours & Company, Wilmington Del., and such commercial materials may be used with good results in the front plane laminate.

The aforementioned U.S. Pat. No. 6,982,178 also describes a method for testing the electro-optic medium in a front plane laminate prior to incorporation of the front plane laminate into a display. In this testing method, the release sheet is provided with an electrically conductive layer, and a voltage sufficient to change the optical state of the electro-optic medium is applied between this electrically conductive layer and the electrically conductive layer on the opposed side of the electro-optic medium. Observation of the electro-optic medium will then reveal any faults in the medium, thus avoiding laminating faulty electro-optic medium into a display, with the resultant cost of scrapping the entire display, not merely the faulty front plane laminate.

The aforementioned U.S. Pat. No. 6,982,178 also describes a second method for testing the electro-optic medium in a front plane laminate by placing an electrostatic charge on the release sheet, thus forming an image on the electro-optic medium. This image is then observed in the same way as before to detect any faults in the electro-optic medium.

Assembly of an electro-optic display using such a front plane laminate may be effected by removing the release sheet from the front plane laminate and contacting the adhesive layer with the backplane under conditions effective to cause the adhesive layer to adhere to the backplane, thereby securing the adhesive layer, layer of electro-optic medium and electrically-conductive layer to the backplane. This process is well-adapted to mass production since the front plane laminate may be mass produced, typically using roll-to-roll coating techniques, and then cut into pieces of any size needed for use with specific backplanes.

The aforementioned 2004/0155857 describes a so-called "double release film" which is essentially a simplified version of the front plane laminate of the aforementioned U.S. Pat. No. 6,982,178. One form of the double release sheet comprises a layer of a solid electro-optic medium sandwiched between two adhesive layers, one or both of the adhesive layers being covered by a release sheet. Another form of the double release sheet comprises a layer of a solid electro-optic medium sandwiched between two release sheets. Both forms of the double release film are intended for use in a process generally similar to the process for assembling an electro-optic display from a front plane laminate already described, but involving two separate laminations; typically, in a first lamination the double release sheet is laminated to a front electrode to form a front sub-assembly, and then in a second lamination the front sub-assembly is laminated to a backplane to form the final display, although the order of these two laminations could be reversed if desired.

The aforementioned 2007/0109219 describes a so-called "inverted front plane laminate", which is a variant of the front plane laminate described in the aforementioned U.S. Pat. No. 6,982,178. This inverted front plane laminate comprises, in order, at least one of a light-transmissive protective layer and a light-transmissive electrically-conductive layer; an adhesive layer; a layer of a solid electro-optic medium; and a release sheet. This inverted front plane laminate is used to form an electro-optic display having a layer of lamination adhesive between the electro-optic layer and the front electrode or front substrate; a second, typically thin layer of adhesive may or may not be present between the electro-optic layer and a backplane. Such electro-optic displays can combine good resolution with good low temperature performance.

The aforementioned 2007/0109219 also describes various methods designed for high volume manufacture of electro-optic displays using inverted front plane laminates; preferred forms of these methods are "multi-up" methods designed to allow lamination of components for a plurality of electro-optic displays at one time.

The aforementioned U.S. Pat. No. 6,982,178 also describes methods for forming an electrical connection between a backplane to which the front plane laminate is laminated and the light-transmissive electrically-conductive layer within the front plane laminate. As illustrated in FIGS. 21 and 22 of this patent, the formation of the layer of electro-optic medium within the front plane laminate may be controlled so as to leave uncoated areas ("gutters") where no electro-optic medium is present, and portions of these uncoated areas can later serve to form the necessary electrical connections. However, this method of forming connections tends to be undesirable from a manufacturing point of view, since the placement of the connections is of course a function of the backplane design, so that FPL coated with a specific arrangement of gutters can only be used with one, or a limited range of backplanes, whereas for economic reasons it is desirable to produce only one form of FPL which can be used with any backplane.

Accordingly, the aforementioned U.S. Pat. No. 6,982,178 also describes methods for forming the necessary electrical connections by coating electro-optic medium over the whole area of the FPL and then removing the electro-optic medium where it is desired to form electrical connections. However, such removal of electro-optic medium poses its own problems. Typically, the electro-optic medium must be removed by the use of solvents or mechanical cleaning, either of which may result in damage to, or removal of, the electrically-conductive layer of the FPL (this electrically-conductive layer usually being a layer of a metal oxide, for example indium tin oxide, less than 1 μm thick), causing a failed electrical connection. In extreme cases, damage may also be caused to the front substrate (typically a polymeric film) which is used to support and mechanically protect the conductive layer. In some cases, the materials from which the electro-optic medium is formed may not be easily solvated, and it may not be possible to remove them without the use of aggressive solvents and/or high mechanical pressures, either of which will exacerbate the aforementioned problems.

Similar methods using selective coating of electro-optic medium and/or selective removal of electro-optic medium may also be applied to the double release films and inverted front plane laminates discussed above.

It is common practice to use laser cutting to separate from a continuous web of FPL pieces of appropriate sizes for lamination to individual backplanes. Such laser cutting can also be used to prepare areas for electrical connections to the backplane by "kiss cutting" the FPL with the laser from the lamination adhesive side so that the lamination adhesive and electro-optic medium are removed from the connection areas, but the electrically-conductive layer is not removed. Such kiss cutting requires accurate control of both laser power and cutting speed if the thin and relatively fragile electrically-conductive layer is not to be removed or damaged. Also, depending upon the location of the connection, bending of the electrically-conductive layer and the associated front substrate may crack the conductive layer, resulting in failure to make a proper connection between the backplane and the conductive layer, and hence display failure.

The aforementioned 2007/0211331 describes methods of forming electrical connections to the conductive layers of front plane laminates. This application describes a first process for the production of a front plane laminate which comprises forming a sub-assembly comprising a layer of lamination adhesive and a layer of electro-optic medium; forming an aperture through this sub-assembly; and thereafter securing to the exposed surface of the lamination adhesive a light-transmissive electrode layer extending across the aperture. The resultant FPL has a pre-cut aperture through the electro-optic medium and adhesive layers, this pre-cut aperture allowing contact to be made with the electrode layer.

The aforementioned 2007/0211331 also describes a second process for the production of a front plane laminate which comprises forming a sub-assembly comprising a layer of lamination adhesive and a layer of electro-optic medium; and thereafter securing to the exposed surface of the lamination adhesive a light-transmissive electrode layer, the electrode layer having a tab portion which extends beyond the periphery of the lamination adhesive and electro-optic layers.

One area of electro-optic display manufacture which still present problems is aligning the FPL or similar front sub-assembly with the backplane. As already noted, the FPL or other front sub-assembly is formed as a web or large sheet which must be cut to provide pieces of appropriate size for formation of single displays. It is normally necessary to ensure that the FPL or similar front sub-assembly piece is accurately aligned with certain features of the backplane; for example, it may be necessary to ensure that an electrode layer in a FPL contacts electrical contacts present on the backplane. The present invention provides methods for facilitating such alignment. One form of the present invention is especially adapted for achieving a clean edge alignment between an FPL or similar front sub-assembly and a backplane substantially the same size as the front sub-assembly.

The present invention also provides a method to facilitate mounting of driver chips or other circuitry on the backplane of an electro-optic display.

SUMMARY OF THE INVENTION

Accordingly, in one aspect this invention provides a process for the production of an electro-optic display, the process comprising:
  forming a sub-assembly comprising in order, a front sheet; a layer of electro-optic medium; and an adhesive layer, the adhesive layer being larger in at least one dimension than the layer of electro-optic material;
  forming an aperture through the adhesive layer in an area where the adhesive layer is not covered by the layer of electro-optic medium;
  bringing the sub-assembly having the aperture formed through the adhesive layer adjacent a backplane comprising at least one electrode and having at least one co-operating member associated therewith, with the aperture engaged with a co-operating member, thereby locating the sub-assembly relative to the backplane.

This process of the present invention may hereinafter for convenience be called the "adhesive layer locating aperture" or "ALLA" process of the invention.

In such an ALLA process, the front sheet may comprise a light-transmissive electrically-conductive layer which will form a front electrode in the final display, so that the sub-assembly has the form of a FPL or inverted FPL. Also, in such a case, the front sheet will typically also comprise at least one supporting or protective layer on the opposed side of the electrically-conductive layer from the layer of electro-optic medium, the supporting or protective layer serving to support the electrically-conductive layer and to protect it against mechanical damage. The supporting or protective layer may also serve other functions, for example by acting as a barrier against water vapor and/or ultra-violet radiation, and/or providing a desired surface texture. (The electro-optic medium is of course normally viewed from the side opposite to the backplane.) Alternatively, the front sheet may comprise a second adhesive layer, typically covered by a release sheet, to permit later lamination of the layer of electro-optic medium to a front electrode and optionally other layers.

In the ALLA process, it is normally desirable to provide at least two locating apertures to ensure that the sub-assembly cannot rotate relative to the backplane and hence is unambiguously fixed in a known position relative to the backplane. It is not necessary that the co-operating member or members be physically located on the backplane; for example, the co-operating members could be provided on a support member, and both the backplane and the sub-assembly provided with apertures which engage the co-operating members on the support member, thereby locating the backplane and the sub-assembly in known positions relative to each other. When, as is typically the case, the sub-assembly is formed as a web or sheet containing material for a plurality of displays, the formation of the aperture through the adhesive layer is conveniently effected at the same time as the sub-assembly is divided into sections corresponding to individual displays. Also, in the ALLA process, typically, the adhesive layer is larger in both dimensions than the layer of electro-optic material.

In another aspect, this invention provides a process for the production of an electro-optic display, the process comprising:
  forming a sub-assembly comprising in order, a front sheet;
  forming an aperture through the front sheet layer of electro-optic medium and adhesive layer;
  securing the sub-assembly to a backplane comprising at least one pixel electrode; and
  mounting at least one electronic circuit device on the backplane, the electronic circuit device extending through the aperture in the sub-assembly.

This process of the present invention may hereinafter for convenience be called the "chip in sub-assembly aperture" or "CSAA" process of the invention.

In the CSSA, the electronic circuit device will typically be at least partially surrounded by a potting material. As is well known in the electronics art, such a potting material can serve to protect bonds between the electronic circuit device and the backplane from environmental contaminants and mechanically stabilize the interconnections between the electronic circuit device and the backplane. In a preferred form of the CSSA process, the potting material contains a portion of the sub-assembly adjacent the aperture.

In the CSSA process, as in the ALLA process, the front sheet may comprise a light-transmissive electrically-conductive layer which will form a front electrode in the final display, so that the sub-assembly has the form of a FPL or inverted FPL. Also, in such a case, the front sheet will typically also comprise at least one supporting or protective layer on the opposed side of the electrically-conductive layer from the layer of electro-optic medium, the supporting or protective layer serving to support the electrically-conductive layer and to protect it against mechanical damage. The supporting or protective layer may also serve other functions, for example by acting as a barrier against water vapor and/or ultra-violet radiation, and/or providing a desired surface texture. Alternatively, the front sheet may comprise a second adhesive layer, typically covered by a release sheet, to permit later lamination of the layer of electro-optic medium to a front electrode and optionally other layers.

In another aspect, this invention provides a process for the production of an electro-optic display, the process comprising:
   forming a sub-assembly comprising in order, a front sheet; a layer of electro-optic medium; and an adhesive layer;
   securing the sub-assembly to a backplane comprising at least one pixel electrode; and
   cutting through both the sub-assembly and the backplane, thereby removing peripheral portions of both the sub-assembly and the backplane, and forming an edge portion in which the edge of the sub-assembly is aligned with the edge of the backplane.

This process of the present invention may hereinafter for convenience be called the "simultaneous trimming" or "ST" process of the invention.

In the ST process, the front sheet may comprise a light-transmissive electrically-conductive layer which will form a front electrode in the final display, so that the sub-assembly has the form of a FPL or inverted FPL. Also, in such a case, the front sheet will typically also comprise at least one supporting or protective layer on the opposed side of the electrically-conductive layer from the layer of electro-optic medium, the supporting or protective layer serving to support the electrically-conductive layer and to protect it against mechanical damage. The supporting or protective layer may also serve other functions, for example by acting as a barrier against water vapor and/or ultra-violet radiation, and/or providing a desired surface texture. The supporting or protective layer may be larger than the layer of electro-optic medium (and possibly larger than the adhesive layer) and only a peripheral portion of the supporting or protective layer may be secured to the backplane, thus forming a seal around the electro-optic medium. In such a case, the ST process may only require cutting through the peripheral portion of the supporting or protective layer and the adjacent portion of the backplane to form the aligned edge portion.

The ST process may be used to do more than simply remove peripheral portions of the sub-assembly and backplane to produce an aligned edge. As described in copending application Ser. Nos. 12/146,063 and 12/146,112, both filed Jun. 25, 2008, and as illustrated below, it may be convenient to provide the sub-assembly with certain auxiliary structures, for example a tacking strip and an inspection tab, which are useful in assembly or testing of the display, but which are not desired in the final product. The trimming of the peripheral portions of the sub-assembly and backplane to produce an aligned edge provides a convenient opportunity for removal of such auxiliary structures. The trimming operation may also conveniently be used to provide mechanical alignment or attachment points, for example by forming apertures through the sub-assembly and backplane.

The electro-optic medium used in the processes of the present invention may be any solid electro-optic medium of the types previously described. Thus, the electro-optic medium may be a rotating bichromal member or electrochromic medium. The electro-optic medium may also be an electrophoretic material comprising a plurality of electrically charged particles disposed in a fluid and capable of moving through the fluid under the influence of an electric field. The electrically charged particles and the fluid may be confined within a plurality of capsules or microcells. Alternatively, the electrophoretic material may be of the polymer-dispersed type, with the electrically charged particles and the fluid present as a plurality of discrete droplets surrounded by a continuous phase comprising a polymeric material. The fluid used may be liquid or gaseous.

This invention extends to the novel sub-assemblies and displays produced by the processes of the present invention. Electro-optic displays produced using the methods of the present invention can be used in any of the applications in which electro-optic displays have previously been used. Accordingly, this invention extends an electronic book reader, portable computer, tablet computer, cellular telephone, smart card, sign, watch, shelf label or flash drive comprising a display of the present invention, or produced using a method or component of the present invention.

BRIEF DESCRIPTION OF THE DRAWINGS

The accompanying drawings are not strictly to scale. In particular, for ease of illustration, the thicknesses of the various layers are greatly exaggerated relative to their lateral dimensions. The present invention is well adapted for the production of thin, flexible electro-optic displays; typically, the sub-assemblies used in the processes described below will have thicknesses of about 100 μm, and can be laminated to flexible backplanes of similar thickness.

DETAILED DESCRIPTION

Figure 1A:
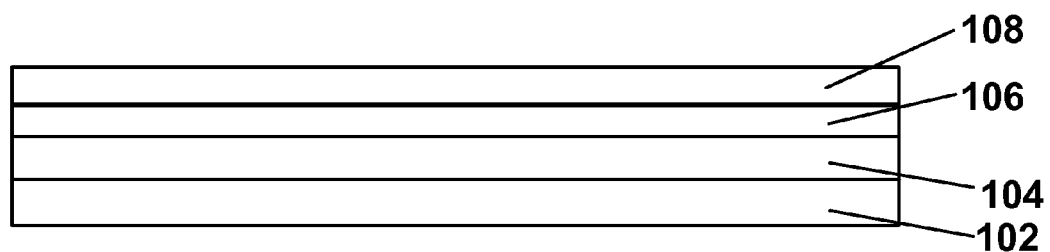
FIGS. 1A to 1E are schematic side elevations of various stages in the production of a sub-assembly used in a process of the present invention which makes use of both the adhesive layer locating aperture and chip in sub-assembly aperture aspects of the invention.

As will be apparent from the foregoing Summary of the Invention, the present invention has a number of different aspects. However, as illustrated in the preferred embodiments discussed below, a single physical electro-optic display or process for the production thereof may make use of multiple aspects of the present invention. For example, the process described below with reference to FIGS. 1A to 1E, 2A and 2B uses both the ALLA and CSSA aspects of the present invention.

Before describing in detail various embodiments of the present invention it is useful to set out certain definitions. The term "backplane" is used herein consistent with its conventional meaning in the art of electro-optic displays and in the aforementioned patents and published applications, to mean a rigid or flexible material provided with one or more electrodes. The backplane may also be provided with electronics for addressing the display, or such electronics may be provided in a unit separate from the backplane. In flexible displays (and the present invention is especially although not exclusively intended for use in flexible displays), it is highly desirable that the backplane provide sufficient barrier properties to prevent ingress of moisture and other contaminants through the non-viewing side of the display. If one or more additional layers need to be added to the backplane to reduce ingress of moisture and other contaminants, the barrier layers should be located as closely as possible to the electro-optic layer so that little or no edge profile of low barrier materials is present between the front (discussed below) and rear barrier layers.

As already indicated, the sub-assembly used in the present processes may comprise at least one electrode layer, most commonly a single continuous front electrode extending across the entire display. Typically, the surface of the sub-assembly which remains exposed after lamination to the backplane will form the viewing surface through which an observer views the display. As with the backplane, the sub-assembly may provide barrier properties to prevent ingress of moisture and other contaminants through the viewing side of the display. If one or more additional layers need to be added to the sub-assembly to reduce ingress of moisture and other contaminants, the barrier layers should be located as closely as possible to the electro-optic layer so that little or no edge profile of low barrier materials is present between the front and rear barrier layers.

Reference will be made hereinafter to "loose" and "tight" release sheets. These terms are used in their conventional meaning in the art to indicate the magnitude of the force necessary to peel the relevant release sheet from the layer with which it is in contact, a tight release sheet requiring more force than a loose release sheet. In particular, if a stack of layers has a tight release sheet on one side and a loose release sheet on the other, it is possible to peel the loose release sheet away from the stack without separating the tight release sheet from the stack.

Some of the displays and sub-assemblies used in the present invention contain two separate adhesive layers. When necessary or desirable, the two adhesive layers will be denoted as "front" and "rear" adhesive layers, these terms denoting the position of the relevant adhesive layer in the final display; the front adhesive layer is the adhesive layer lying between the electro-optic medium and the viewing surface of the display, while the rear adhesive layer lies on the opposed side of the electro-optic layer from the front adhesive layer. In the common situation where a display has a single front electrode between the electro-optic layer and the viewing surface and a plurality of pixel electrodes on the opposed side of the electro-optic layer, the front adhesive layer lies between the electro-optic layer and the front electrode, while the rear adhesive layer lies between the electro-optic layer and the pixel electrodes.

A preferred process which makes use of both the ALLA and CSSA aspects of the present invention will now be described with reference to FIGS. 1A to 1E and 2A to 2B of the accompanying drawings.

FIGS. 1A to 1E are schematic sections through various stages in the production of a sub-assembly used in a first process of the present invention. In the first step of the process, an electro-optic medium is coated or otherwise deposited on to a tight release sheet 102 to form an electro-optic layer 104. Separately, a front adhesive layer 106 is coated on to a loose release sheet 108. The two resulting sub-assemblies are then laminated to each other with the adhesive layer 106 is contact with the electro-optic layer 104 to produce the structure shown in FIG. 1A. These steps are as described in the aforementioned U.S. Pat. No. 7,110,164, and the resulting assembly is a double release sheet as described in the aforementioned 2004/0155857.

In the second step of the process, the structure shown in FIG. 1A is kiss cut with the loose release 108 facing the cutter (typically a laser cutter), the kiss cutting being effected such that the loose release sheet 108, the front adhesive layer 106 and the electro-optic layer 104 are severed but the tight release sheet 102 is not. The continuous portions of the loose release sheet 108, the front adhesive layer 106 and the electro-optic layer 104 are then removed, either manually or mechanically, thus leaving the structure shown in FIG. 1B, in which there extend upwardly from the tight release sheet 102 multiple "mesas" comprising the islands 208 of the loose release sheet and similarly sized areas 206 and 204 of the front adhesive layer and electro-optic layer respectively. Each of these mesas will eventually form a separate display. (In some cases, it may be possible to recycle the portions of the front adhesive layer and electro-optic layer removed with the loose release sheet 108 in other small displays.)

Figure 1B:
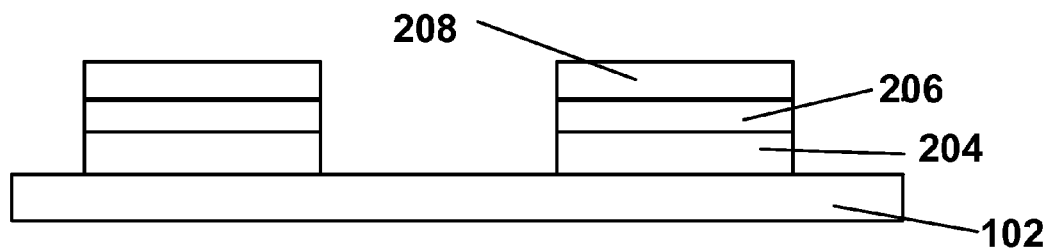

The stages of the process described thus far will typically be carried out either on continuous webs of material, or on large sheets of material sufficient to form several final displays. For ease of illustration, FIG. 1B shows only two separate mesas but it will be appreciated that in practice a larger number of mesas will be present on a single large sheet or web. When the process is carried on a web, on a roll-to-roll basis, the webs used may include tractor feed holes formed along the side edges of the web of material to serve as alignment holes.

In the next step, the remaining portions 208 of the loose release sheet are peeled from the structure shown in FIG. 1B and the remaining layers of the structure are laminated to a sheet of a front substrate 120. The front substrate 120 is a multi-layer structure including an indium-tin-oxide (ITO) layer which forms the front electrode of the final display. The front substrate may further comprise a removable masking film, which can be removed before the final display is placed in use.

Figure 1C:
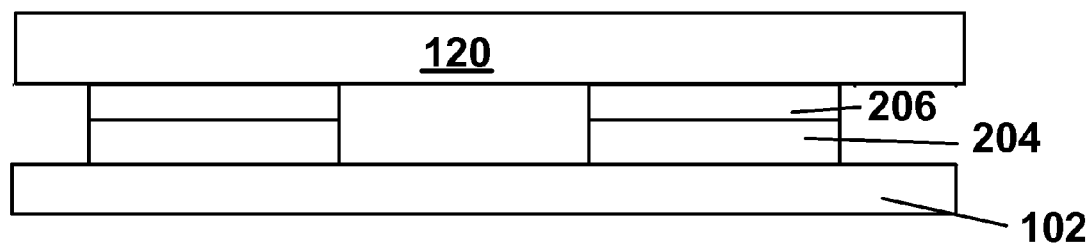
Figure 1D:
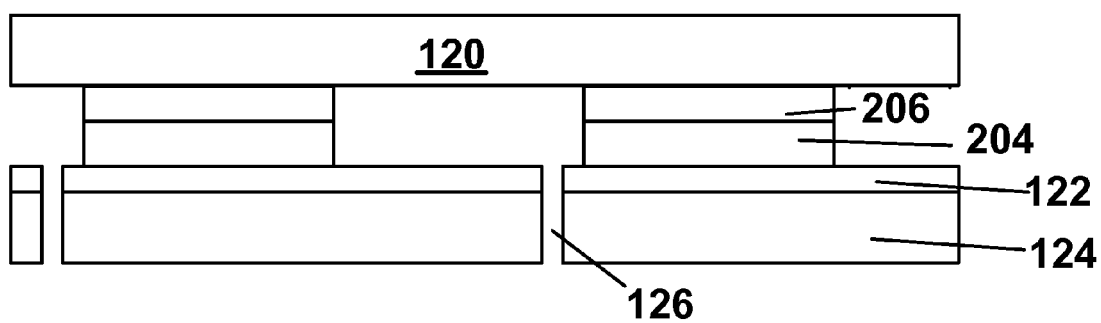

The front substrate is designed to provide the front light-transmissive electrode for the final display. The front substrate 120 can also provide the necessary mechanical support for this thin and relatively fragile front electrode. In addition, the front substrate preferably provides all necessary water vapor and oxygen barriers, and ultra-violet absorption properties, desirable to protect certain electro-optic layers, especially electrophoretic layers. The front substrate may also provide desirable anti-glare properties to the viewing surface of the final display. The front substrate 120 serves all of these functions while still being thin and flexible enough to enable the formation of a final display sufficiently flexible to be wound around a mandrel of (say) 15 mm diameter. As already noted, the front substrate includes a masking film; this masking film is provided primarily to increase the thickness of the front substrate so as to facilitate handling of this substrate during laminations. In a preferred process, the total thickness of the front substrate as it remains in the final display (i.e., with the masking film removed) is only about 1 mil (25 μm) and the masking film is used to add about 2 mil (51 μm) to this thickness for ease of handling. The masking film also typically serves to prevent scratching or adhesion of dust or debris to an adjacent anti-glare layer during the laminations. The structure resulting from this step of the process is shown in FIG. 1C.

The steps of the process described so far as essentially identical to those of the process described with reference to FIGS. 2A to 2E of the aforementioned 2008/0057252, to which the reader is referred for further information.

Figure 2A:
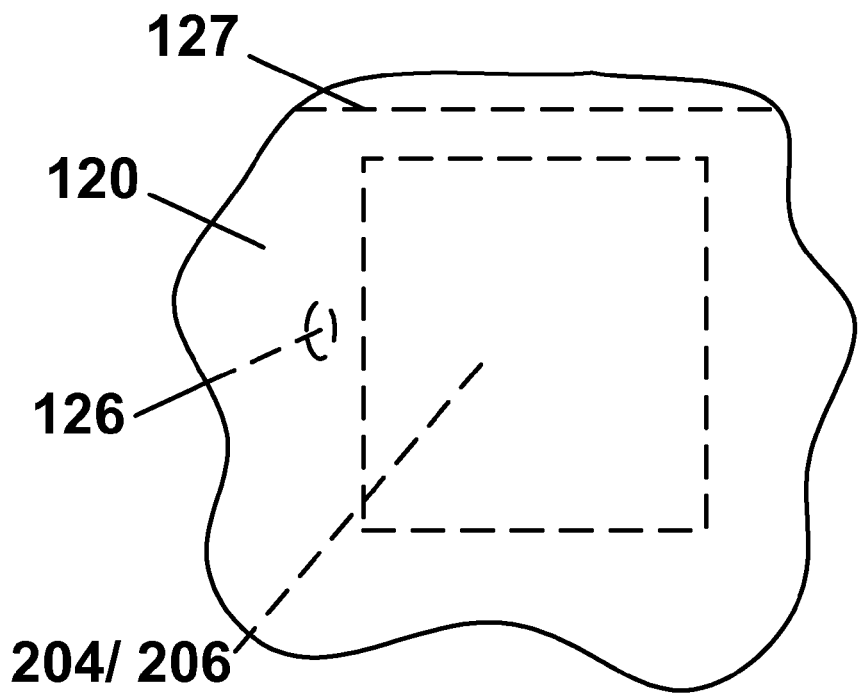
FIGS. 2A and 2B are schematic top plan views at the same stages of the process as FIGS. 1D and 1E respectively.

At this point, a second, thin adhesive layer 122 is coated on to a third release sheet 124, and apertures 126 are formed though both the adhesive layer 122 and the release sheet 124 at positions corresponding to where top plane connections (connections between the backplanes and the front electrodes) will be present in the final displays. At the same time, the release sheet is cut, preferably discontinuously, along a line 127 (see FIG. 2A) to form a tacking strip (discussed further below). The release sheet 102 is peeled from the structure shown in FIG. 1C and the adhesive layer 122 laminated to the electro-optic layer portions 204 to give the structure shown in FIG. 1D. FIG. 2A shows a corresponding top plan view which only illustrates a single mesa and its associated aperture 126 and the line 127; at this stage of the process, the material is still in web or large sheet form and FIG. 2A illustrates only part of the web or sheet, as indicated by the curved boundary of front substrate 120 in FIG. 2A. The adhesive layer 122 must of course be correctly aligned with respect to the mesas to ensure that the apertures 126 and the line 127 are in the proper positions relative to their associated mesa, as shown in FIG. 2A. (For ease of illustration, FIG. 2A shows only a single aperture 126 associated with the mesa. In practice, it is usually desirable to provide two or more apertures 126 associated with each mesa so as to provide redundant top plane connections in each final display, thereby ensuring that each display will still function correctly even if one of its top plane connections is not correctly formed or becomes damaged during use.)

Figure 1E:
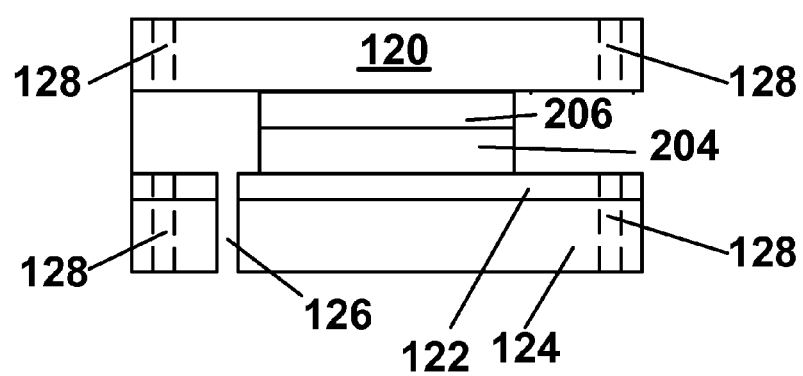
Figure 2B:
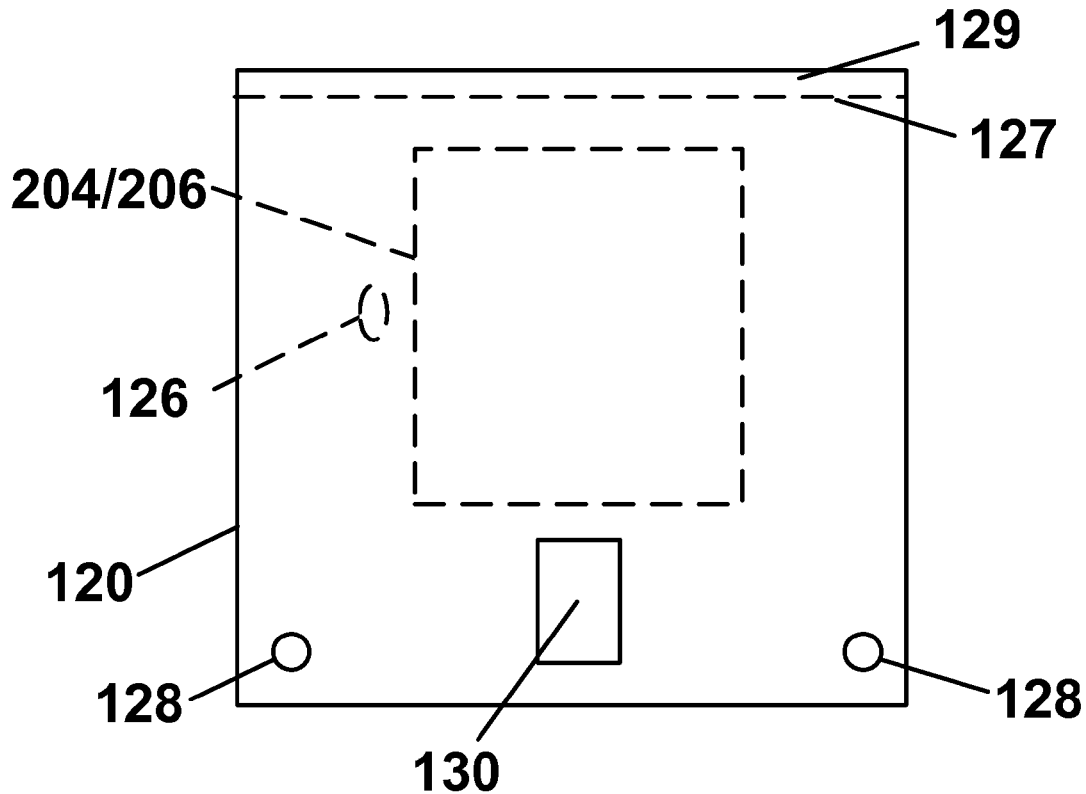

The next stage of the process is singulation, that is to say separation of the portions of the sub-assembly corresponding to individual displays. The result of this singulation step is illustrated in FIGS. 1E and 2B. The singulation step simultaneously effects three logically separate operations, namely:

(a) cutting of the sheet or web into pieces of the size required for individual displays;
(b) formation of apertures through the adhesive layer 122, the front substrate 120 and the release sheet 124 required for mechanical alignment of the sub-assembly during subsequent lamination to a backplane; and
(c) formation of an aperture through the front substrate 120, and the adhesive layer 122, this aperture being ultimately used to mount an electronic circuit device on the backplane of the final display.

As illustrated in FIGS. 1E and 2B, operation (a) is effected by cutting the front substrate 120, the adhesive layer 122 and the release sheet 124 along the same rectangular perimeter, thus defining a separate unit (piece) of front plane laminate which will eventually be laminated to a backplane to form a single display. In addition to the singulation of the separate unit of front plane laminate, this step creates an extended tab or "tail" of non-optically active material (the portion of the front plane laminate lying below the electro-optic layer 204 as illustrated in FIG. 2B) that adds to the thickness of the corresponding section of the final display. Were this tail of non-optically active material not present, the thickness of the final display in this region would be only the thickness of the backplane itself, and in thin, flexible displays, the thickness of this backplane may be only about 25 μm; the extended tail section will typically provide an additional 25 μm of thickness, thus doubling the thickness of this region to about 50 μm. See the aforementioned 2007/0211331 for further discussion of providing a tab or tail portion of a front electrode layer, and use of such a tab or tail portion to provide electrical contact with the front electrode layer.

Operation (b) is effected by providing two small circular apertures 128 adjacent one edge (the lower edge as illustrated in FIG. 2B) of the rectangular front plane laminate. (For ease of comprehension, the apertures 128 are shown in broken lines in FIG. 1E even though FIG. 1E is a section looking upwardly in FIG. 2B so the apertures 128 would not actually be visible in the section of FIG. 1E.) As shown in FIG. 1E, the apertures 128 lie within the tail section of the FPL and extend through the whole thickness of the FPL, passing through the front substrate 120, the adhesive layer 122 and the release sheet 124. The apertures 128 can be used to facilitate mechanical alignment or attachment of the FPL during lamination to a backplane or during later stages of manufacture. As described below with reference to FIGS. 4A to 4C, the apertures 128 can be used to engage registration pins or similar co-operating members provided on the backplane, or on a substrate carrying the backplane, to ensure accurate registration of the FPL with respect to the backplane. The apertures 128 can also be used in later stages of the manufacturing process to locate the final display module accurately with respect to a housing or other surrounding portion (for example, a printed circuit board) of the final commercial display unit, or to attach the display module to such housing or surrounding portion.

Operation (c) is effected by providing a rectangular aperture 130 in the tail portion of the FPL, this rectangular aperture 130 extending completely through the FPL, i.e., through the front substrate 120, the adhesive layer 122 and the release sheet 124. As discussed below with reference to the ST process of the present invention, the type of FPL shown in FIGS. 1E and 2B is typically used with a backplane which is essentially the same size as the FPL, so that the FPL covers essentially the whole of the backplane. Accordingly, if it is desired to have electrical access to the backplane, for example for mounting driver chips on the backplane, an aperture must be formed to permit this, and this is the function of the aperture 130. Driver chips or other electronic circuit devices can be placed within the aperture 130, and the FPL surrounding the aperture provides a region of increased thickness which assists ruggedization of the display.

As also illustrated in FIG. 2B, the singulation of the FPL piece from the web results in the line 127 extending close to and parallel to one edge of the FPL piece, so that between the line 127 and the adjacent edge is formed a tacking strip 129, in the form of an elongate area running along one edge of the FPL piece. Because the release sheet 124 is severed along line 127, the section of the release sheet 124 underlying the tacking strip 129 can be removed without removing the release sheet 124 from the main part of the FPL piece. The tacking strip 129 is provided to assist in locating the FPL piece on a backplane prior to the lamination of these two parts to form a display; the section of the release sheet 124 underlying the tacking strip 129 is removed and the portion of the adhesive layer 122 thus exposed can be pressed manually into the correct position for lamination to the backplane, before the main portion of the release sheet 124 is removed and the lamination operation completed.

Figure 3:
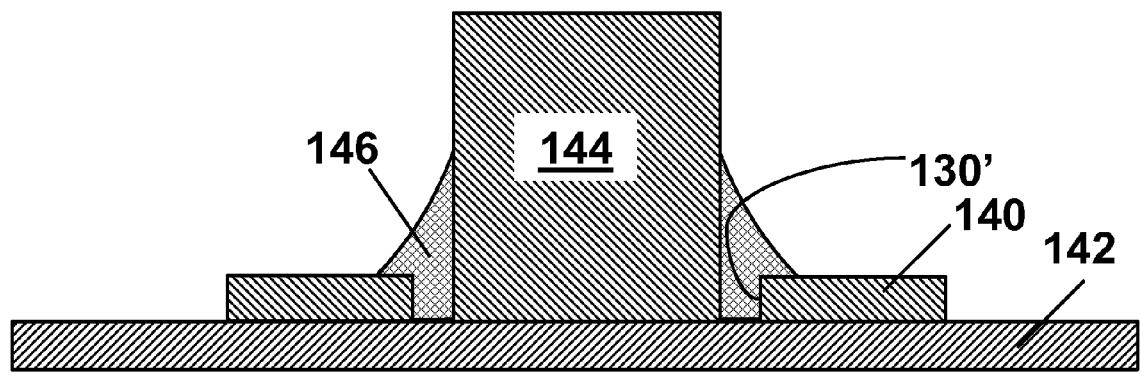
FIG. 3 is a schematic side elevation showing a chip disposed in an aperture in a display formed from the sub-assembly produced in FIGS. 1A to 1E, 2A and 2B.

FIG. 3 of the accompanying drawings is a highly schematic side elevation of a driver die 144 disposed within an aperture (designated 130') of a display formed by laminating a front plane laminate 140 to a backplane 142. As shown in FIG. 3, the driver die 144 extends through the aperture 130' and makes electrical contact with contacts (not shown) present on the backplane 142. A potting material 146 surrounds the die 144 and contacts portions of the FPL 140 surrounding the aperture 130', this potting material 146 serving to protect the drive contacts from environmental factors and to mechanically stabilize the interconnection between the die 144 and the backplane 142.

Figure 4A:
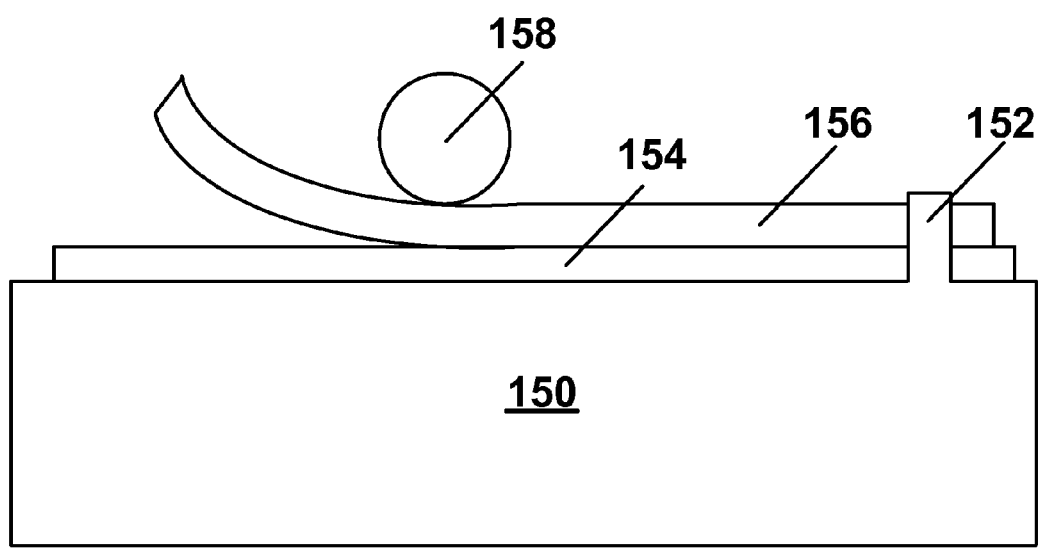
FIGS. 4A to 4C are schematic side elevations of various stages in a first simultaneous trimming process of the present invention, while FIG. 4A also illustrates the manner in which the front plane laminate shown in FIGS. 1E and 2B can be laminated to a backplane.
Figure 4B:
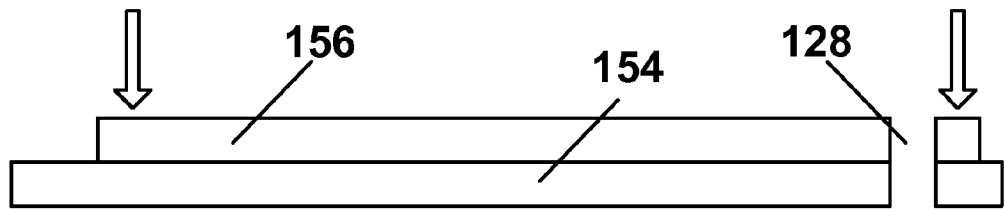
Figure 4C:
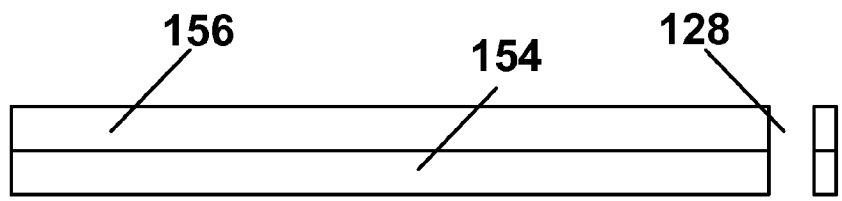

FIG. 4A illustrates, in a highly schematic manner, a process in which the piece of front plane laminate shown in FIGS. 1E and 2B is laminated to a backplane. As shown in FIG. 4A, a support table 150 is provided with a pair of pins 152 (only one of which is visible in FIG. 4A). A backplane 154 is provided with apertures which engage the pins 152. The release sheet 124 (see FIG. 1E) is removed from the front plane laminate 156, which is then laid over the backplane with the apertures 128 (see FIGS. 1E and 2B) engaged with the pins 152. A roller 158 passes over the front plane laminate 156, thus adhering the adhesive layer 122 (see FIG. 1E) to the adjacent surface of the backplane 154 and thus laminating the front plane laminate to the backplane to form a display. Following this lamination, the laminated FPL and backplane are removed from the support table 150 as the structure shown in FIG. 4B. (The meaning of the arrows in FIG. 4B will be explained below with reference to the ST process of the present invention.)

Detailed consideration will now be given to the simultaneous trimming (ST) process of the present invention. As noted above, when laminating front plane laminates to a backplane, the FPL must typically be aligned with respect to backplane features, for example contact pads designed to provide contacts to the electrode layer present in the front plane laminate. Depending on the design requirements, the FPL can be designed to be smaller than the backplane (to allow access to electrical connections on areas of the backplane not covered by the FPL) or the same size as the backplane. If the FPL, or a barrier layer laminated over the FPL, is the same size as the backplane, achieving a clean edge alignment can be difficult in practice, since there is always some tendency for the FPL not to line up exactly with the backplane. Also, certain features desirable during manufacture, such as inspection tabs or tacking strips, can be undesirable if present in the finished display module.

There is an increasing tendency to use electro-optic media with thin backplanes based on polymeric films (for example, poly(ethylene terephthalate) or poly(ethylene naphthalate), PEN, available commercially under the Registered Trade Mark TEONEX from DuPont Teijin Films of Hopewell Va.) or metal foils. Electro-optic displays based on such thin backplanes can be flexible or rollable and hence usable in certain applications (for example, a large display screen capable of being stored in a cellular telephone—see the aforementioned 2002/0090980) where traditional displays cannot be used. It has now been found that, using the simultaneous trimming process of the present invention, an FPL laminated to such a polymeric or metal foil backplane can readily be cut by industrial methods, for example laser cutting or die cutting, and that such cutting of an FPL/backplane laminate enables an accurately matched edge to be achieved between the FPL (or a barrier layer overlying the FPL) and the backplane, without adverse effects on the functionality of the final display. Such cutting also allows for the removal of features useful during manufacture but not wanted in the final display.

Figure 5:
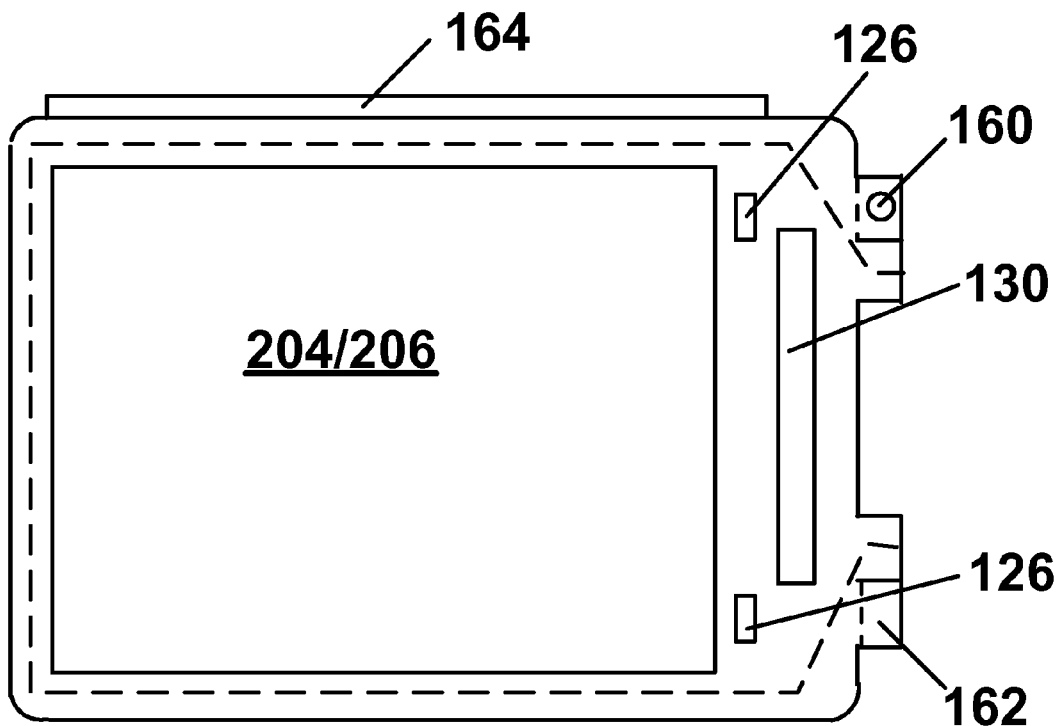
FIG. 5 is a top plan view of the front plane laminate used in the process shown in FIGS. 4A to 4C.

A preferred simultaneous trimming process of the present invention will now be described with reference to FIGS. 4A to 4C and 5. FIG. 5 shows a front plane laminate which is generally similar to that shown in FIG. 2B. In FIG. 5, the electro-optic layer 204, the adhesive layer 206, and the apertures 126 and 130 differ in size and position from the corresponding integers in FIG. 2B but are otherwise similar and serve the same functions. However, the front plane laminate shown in FIG. 5 has a number of additional features. These features include a top plane contact tab 160, which is used to make electrical contact with the electrode layer of the FPL during testing, a release contact tab 162 which is similarly used to make electrical contact with a conductive layer provided in the release sheet 124 for testing purposes (see the testing methods described in the aforementioned U.S. Pat. No. 6,982,178) and a tacking strip 164. The tacking strip 164 is constructed in the same manner as, and functions in the same way as, the tacking strip 129 described above with reference to FIGS. 2A and 2B.

The FPL shown in FIG. 5 is designed to be laminated to a backplane having transistors on a thin plastic film, for example a PEN film. The lamination of the FPL to the PEN film backplane is effected in the manner shown in FIGS. 4A and 4B, as previously described. The resulting laminate is then trimmed by laser cutting (die cutting could alternatively be used), as indicated schematically by the arrows in FIG. 4B and along the periphery indicated by the broken line in FIG. 5 to produce the final display module, illustrated schematically in FIG. 4C. This trimming operation removes the contact tabs 160 and 162, and the tacking strip 164. Apertures for mechanical alignment or for attachment points can be incorporated into the display during the trimming operation. Such apertures may be useful, for example, for securing the display to fixtures, or for optical alignment, during later manufacturing operations or for securing the display to a display housing.

In the simultaneous trimming process shown in FIGS. 4A to 4C and 5, the front substrate of the FPL acts as a barrier layer protecting the electro-optic layer from environmental contaminants and radiation. However, as described for example in the aforementioned U.S. Pat. No. 6,982,178 (see especially FIGS. 18-20 and the related description), electro-optic display can be produced having a barrier layer which is separate from the front substrate of the display, with an edge seal formed between the barrier layer and the backplane. The ST process of the present invention can also be applied to this type of display, and a preferred process of this type is illustrated in FIGS. 6A and 6B.

Figure 6A:
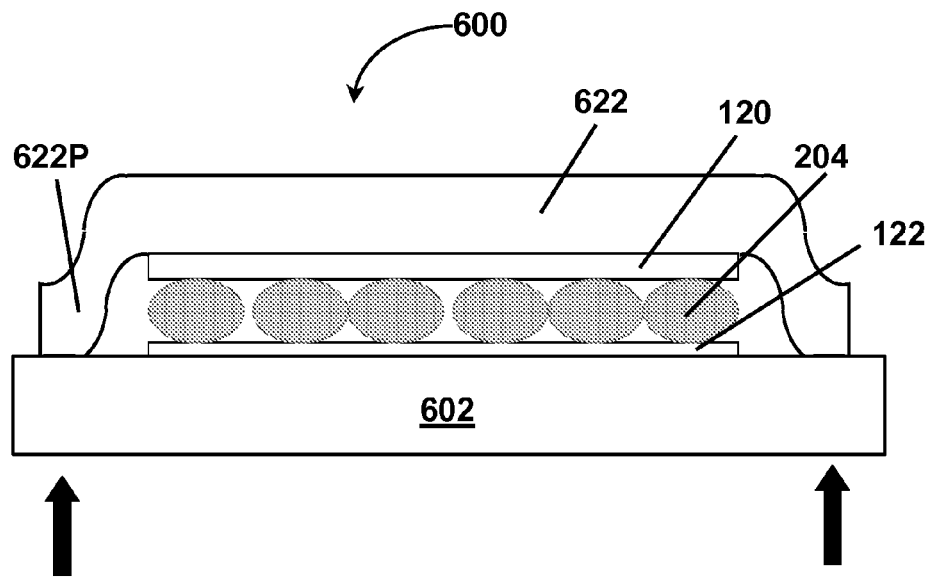
FIGS. 6A to 6B are schematic cross-sections illustrating different stages in a second simultaneous trimming process of the present invention.

FIG. 6A illustrate a barrier-layer-protected display (generally designated 600) of the type shown in FIG. 3 of the aforementioned 2007/0152956. The display 600 comprises a backplane 602, an adhesive layer 122, an electro-optic layer 204 (illustrated as an encapsulated electrophoretic layer in FIG. 6A), a front substrate 120 and a barrier layer 622. A peripheral portion 622P of the barrier layer 622 is crimped around the periphery of the electro-optic layer 204 and sealed, either adhesively or, depending upon the materials used, in some cases by welding, to the peripheral part of the backplane 602 to form an edge seal which seals the electro-optic layer 204 from outside contaminants.

It will be seen from FIG. 6A that the barrier layer 622 is slightly smaller than the backplane 602; in practice, with this type of edge seal it is very difficult to keep the edges of the barrier layer and the backplane closely aligned. In accordance with the ST process of the present invention, the structure shown in FIG. 6A can be cut, as indicated by the arrows in that Figure, to produce the structure shown in FIG. 6B, in which the edges of the barrier layer and backplane are aligned.

Figure 6B:
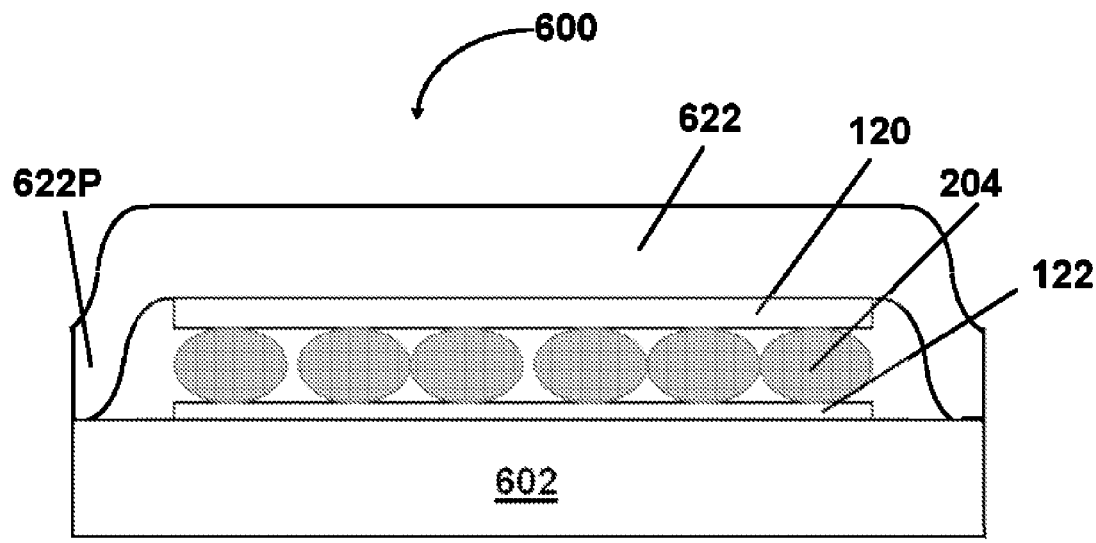

The ST process shown in FIGS. 6A and 6B only cuts through the barrier layer and the backplane. Other ST processes may require cutting through the barrier layer, the backplane, and one or more of the electro-optic layer, adhesive layers and front substrate.

Figure 6C:
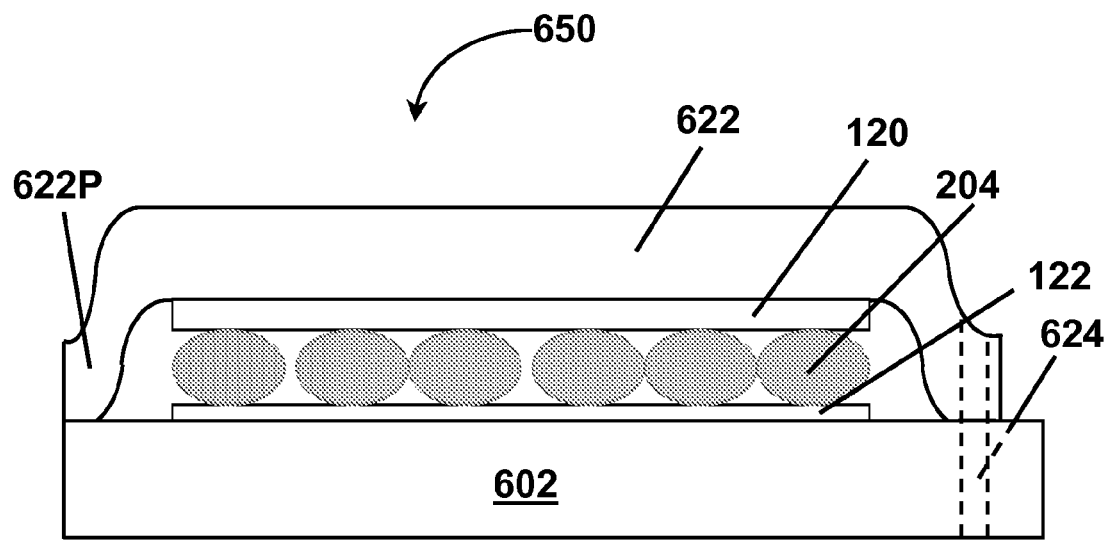
FIG. 6C is a schematic cross-section, similar to those of FIGS. 6A and 6B, through a modified version of the display shown in FIGS. 6A and 6B.

FIG. 6C shows a modified display (generally designated 650) generally similar to the display of FIG. 6B but having an aperture 624 extending through a peripheral portion thereof. The display 650 of FIG. 6C is produced from the untrimmed display 600 shown in FIG. 6A, and the left-hand side of the display 600 (as illustrated in FIG. 6A) is trimmed in the same way as in FIG. 6B to provide a trimmed edge. However, the right-hand edge of display 600 is not trimmed but instead a punch (not shown) is used to form the aperture 624 extending through the display 650.

It will be apparent to those skilled in the technology of electro-optic displays that numerous changes and modifications can be made in the preferred embodiments of the present invention already described without departing from the scope of the invention. For example, in the preferred processes of the invention illustrated in the drawings, the inverted front plane laminate is cut into pieces of the size required for an individual display (see FIGS. 1E and 2B) before being laminated to a backplane. When high volume production is desired, it may be convenient to reverse the order of these singulation and lamination operations, i.e., a sheet or web of inverted front plane laminate sufficient to form a plurality of displays could be laminated in an aligned manner to a sheet or web of backplanes to form a plurality of displays which are thereafter singulated from the sheet. When the lamination operation is performed on sheets, the sheet of backplanes will typically be held on a support member during the lamination, and the singulation operation can be effected with the sheet of displays still held on the support member. Such a process permits singulation of the displays and the ST process of the present invention to be effected in a single operation.

Furthermore, although the invention has been shown in FIGS. 6A and 6B applied to an edge seal formed by sealing a protective layer to a backplane, the present invention can be used with a variety of other types of edge seals. In particular, the aforementioned U.S. Pat. No. 6,982,178 describes several different types of so-called "underfill edge seals" in which peripheral portions of a backplane, and either a front substrate or a protective layer overlying a front substrate, extend outwardly beyond the periphery of an electro-optic layer, and an edge seal is formed extending between the peripheral areas of the backplane and either the front substrate or the protective layer. The simultaneous trimming process, and the other processes of the present invention, can be applied to displays having such underfill edge seals either before or after the edge sealing material is applied. Similarly, although the processes of the present invention have primarily been described above with reference to displays constructed using inverted front plane laminates, these processes can also be used with displays using "classic" front plane laminates, double release films and other sub-assemblies.

Numerous other variations of the processes of the present invention will readily be apparent to those skilled in the technology of electro-optic displays. Accordingly, the whole of the foregoing description is to be construed in an illustrative and not in a limitative sense.

The invention claimed is:

1. A process for the production of an electro-optic display, the process comprising:
    forming a sub-assembly comprising in order, a front sheet; a layer of electro-optic medium; and an adhesive layer;
    forming an aperture through the front sheet and adhesive layer;
    securing the sub-assembly to a backplane comprising at least one pixel electrode; and
    mounting at least one electronic circuit device on the backplane, the electronic circuit device extending through the aperture in the sub-assembly.

2. A process according to claim 1 wherein a potting material at least partially surrounds the electronic circuit device.

3. A process according to claim 2 wherein the potting material contacts a portion of the sub-assembly adjacent the aperture.

4. A process according to claim 1 wherein the front sheet comprises a light-transmissive electrically-conductive layer.

5. A process according to claim 1 wherein the front sheet comprises an electrically-conductive layer and at least one supporting or protective layer on the opposed side of the electrically-conductive layer from the layer of electro-optic medium, the supporting or protective layer serving to support the electrically-conductive layer and to protect it against mechanical damage.

6. A process according to claim 1 wherein the front sheet comprises a second adhesive layer.

7. A process according to claim 6 wherein the second adhesive layer is covered by a release sheet.

8. A process according to claim 1 wherein the electro-optic medium comprises a rotating bichromal member or electrochromic medium.

9. A process according to claim 1 wherein the electro-optic medium comprises an electrophoretic medium comprising a plurality of electrically charged particles disposed in a fluid and capable of moving through the fluid under the influence of an electric field.

10. A process according to claim 9 wherein the electrically charged particles and the fluid are confined within a plurality of capsules or microcells.

11. A process according to claim 9 wherein the electrically charged particles and the fluid are present as a plurality of discrete droplets surrounded by a continuous phase comprising a polymeric material.

12. A process according to claim 9 wherein the fluid is gaseous.

* * * * *

UNITED STATES PATENT AND TRADEMARK OFFICE
CERTIFICATE OF CORRECTION

| | | |
|---|---|---|
| PATENT NO. | : 8,034,209 B2 | |
| APPLICATION NO. | : 12/147571 | |
| DATED | : October 11, 2011 | |
| INVENTOR(S) | : Danner et al. | |

It is certified that error appears in the above-identified patent and that said Letters Patent is hereby corrected as shown below:

Cover page, left column, item (73) to read as follows:

(73) E Ink Corporation, Cambridge, MA (US)

Creator Technology B.V., Breda (NL)

Signed and Sealed this

Seventh Day of February, 2012

David J. Kappos
*Director of the United States Patent and Trademark Office*